United States Patent [19]

Burrell, deceased et al.

[11] 4,160,921
[45] Jul. 10, 1979

[54] THYRISTOR CONTROL

[76] Inventors: Charles W. Burrell, deceased, late of Los Altos, Calif. by Mildred G. Burrell, executrix, 226 Verano Dr., Los Altos, Calif. 94022

[21] Appl. No.: 912,539

[22] Filed: Jun. 5, 1978

[51] Int. Cl.² .......................... H03K 3/36; H03B 7/06
[52] U.S. Cl. ................................ 307/252 M; 363/135
[58] Field of Search ................... 307/140, 252 L, 305, 307/246, 284, 287, 142, 252 M, 282, 314, 275, 252 J; 331/113 A, 113 S, 148, 112, 146; 323/8; 361/54; 363/124, 135; 328/67

[56] References Cited

U.S. PATENT DOCUMENTS

| | | | |
|---|---|---|---|
| 3,273,046 | 9/1966 | Bedford | 321/45 |
| 3,324,381 | 6/1967 | Back et al. | 321/35 |
| 3,354,322 | 11/1967 | Eastop | 307/88.5 |
| 3,365,640 | 1/1968 | Gurwicz | 318/345 |
| 3,548,216 | 12/1970 | Burch | 307/252 |
| 3,549,908 | 12/1970 | Houlne | 307/252 |
| 3,610,963 | 10/1971 | Higgins | 307/275 |
| 3,641,364 | 2/1972 | Rippel | 307/240 |
| 3,652,874 | 3/1972 | Partridge | 307/252 M |
| 3,701,939 | 10/1972 | Petersen et al. | 321/45 R |

Primary Examiner—L. T. Hix
Assistant Examiner—James L. Dwyer
Attorney, Agent, or Firm—Limbach, Limbach & Sutton

[57] ABSTRACT

An improved, D.C. shut-off control circuit for a thyristor is provided by means of a transformer having a tapped primary which is connected between a D.C. supply and the thyristor and which has two secondary windings: one is used during shut off to generate an opposing magnetic field in the transformer core which cancels the magnetic field generated by the flow of current through the primary winding to the thyristor. When current to the first secondary winding is shut off, this secondary magnetic field collapses and causes a reverse current in the primary which effectively blocks current to the thyristor and simultaneously generates a voltage in the second secondary winding of the transformer which biases a transistor switch to connect the primary tap to the circuit ground, thereby using the magnetically induced voltage in the primary to reverse bias the thyristor and positively shut it off. In a modified embodiment, this shut-off sequence is operated repetitively and sequentially in an inverter circuit by means of interconnected transistor and diode switches.

14 Claims, 2 Drawing Figures

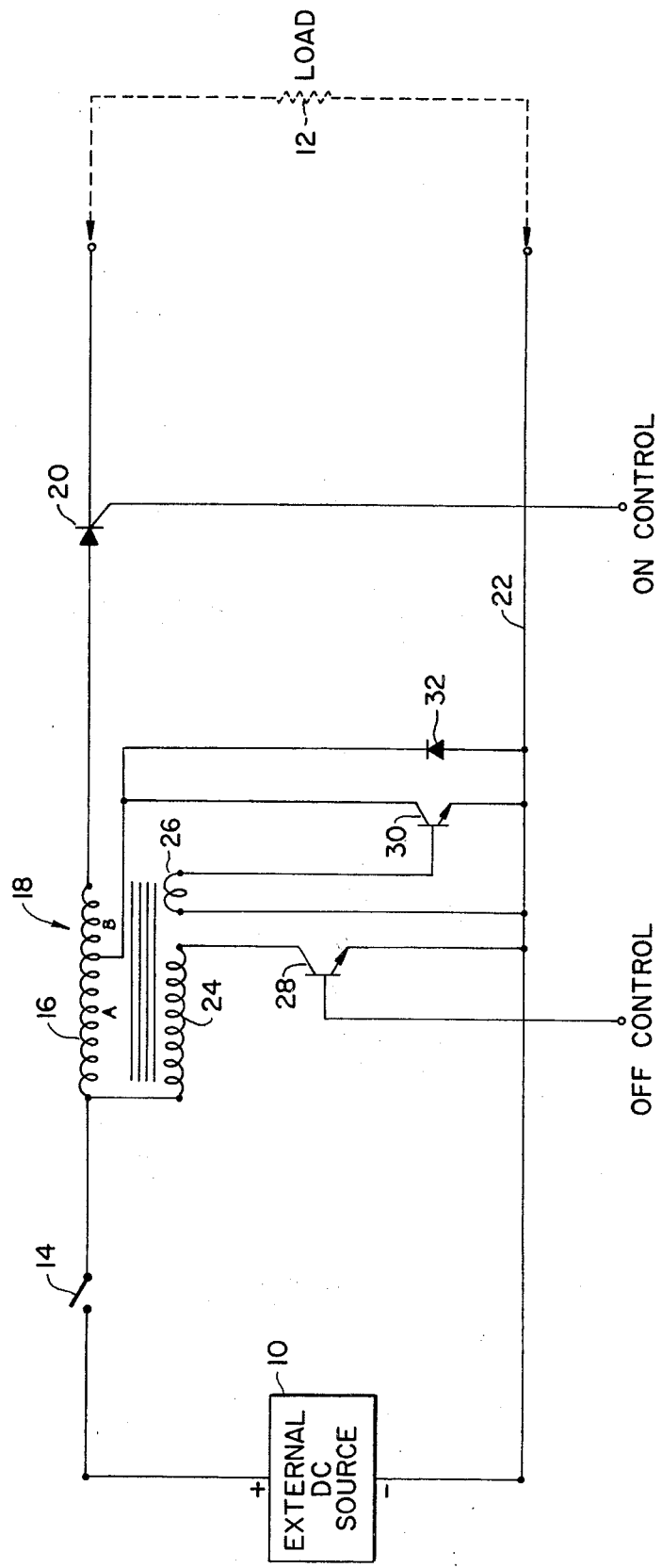
FIG._1.

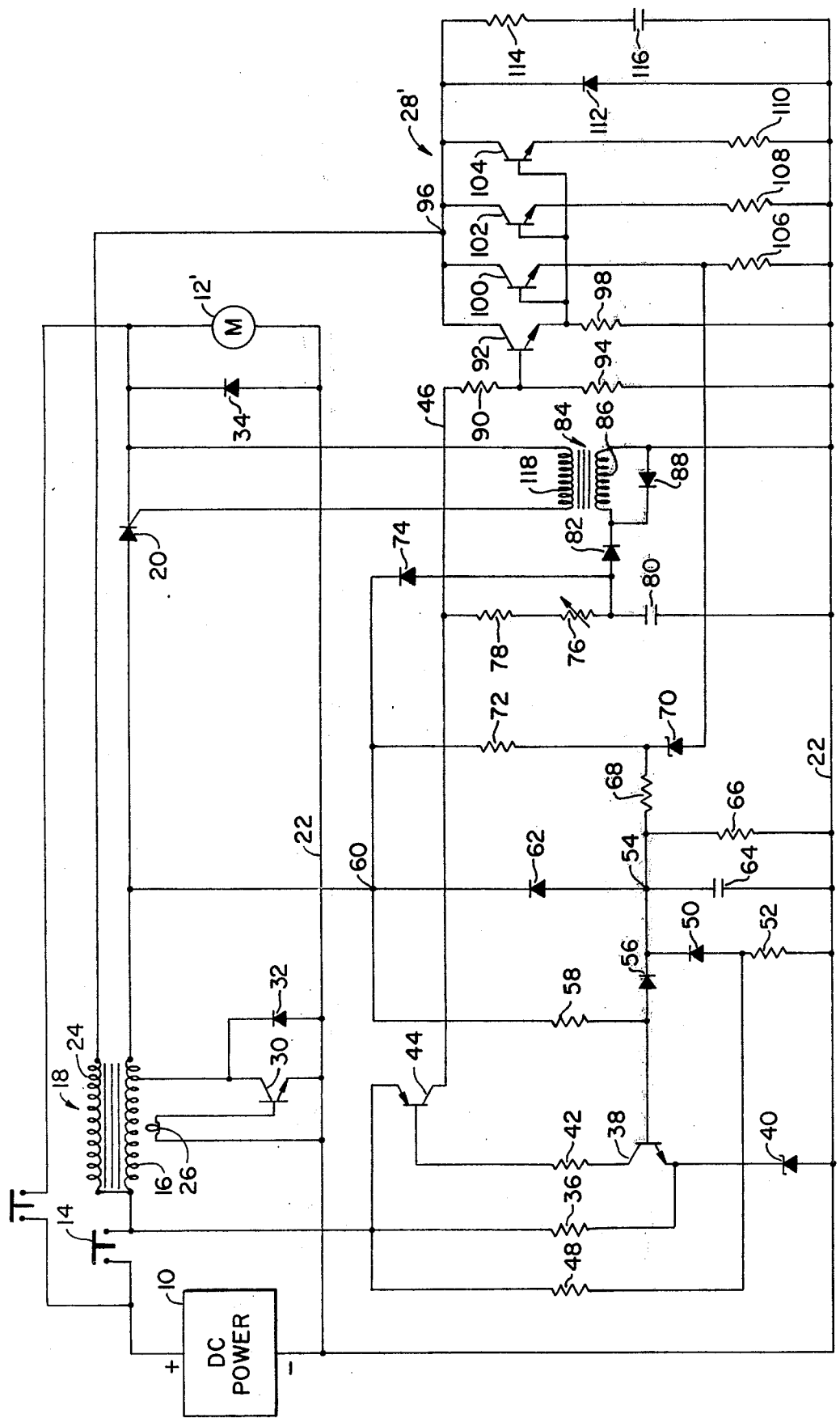
FIG._2.

THYRISTOR CONTROL

BACKGROUND OF THE INVENTION

This invention relates to electronic commutation and more particularly to an improved method and apparatus for stopping current conduction through a thyristor in order to control the flow of direct current power in a desired manner.

To commutate a thyristor such as a silicon-controlled rectifier (SCR), that is, to switch it off when it has been conducting, the current passing through the SCR must be reduced below a critical value known as the holding current. The SCR does not, however, immediately regain its forward blocking characteristic and a short time must elapse before voltage is reapplied in the forward direction. This recovery time can be reduced by passing reverse current through the SCR during the switching off operation. There are a number of prior art SCR commutation circuits, most of which use inductive or capacitive circuitry to induce a counter current within the SCR to shut it off. These circuits suffer from various disadvantages such as high manufacturing costs, circuit complexity, unreliability, generation of electrical transients, and the generation of electrical stresses within the SCR. The above and other disadvantages of prior art SCR commutation circuits are overcome by the present invention.

SUMMARY OF THE INVENTION

The control circuit of the invention is intended for use with a reverse blocking thyristor which controls the supply of direct current from an external source to a load. The invention comprises a common lead, a reverse blocking triode thyristor having separate anode, cathode and gate leads, and a transformer having a saturable core, a tapped primary winding, a first secondary winding wound in opposition to the primary winding, and a secondary winding. The D.C. power supply, the primary winding, the thyristor, the load and the common lead are all connected together in series. A first switch is connected in series with the first secondary winding between the common lead and the D.C. power supply. The second secondary winding is connected between the common lead and a control terminal of a second, electronic switch. The switching electrodes of the electronic switch are connected between the common lead and the tap of the transformer's primary winding.

Means are provided for initially applying a signal to the thyristor gate to cause the thyristor to become conductive and allow electrical current to flow through the primary winding and the load, thereby generating a magnetic field in the primary winding and the transformer core. Separate means are also provided for causing the first switch to become conductive for a preselected period of time which is sufficient to cause a current from the D.C. power supply to flow through the first secondary winding and generate a magnetic field in the transformer core which opposes and cancels the primary winding magnetic field. The duration of the switch closure is timed so that the first switch is not opened until after the transformer core becomes saturated.

Upon the opening of this first switch a current is momentarily generated in the primary winding by the collapsing magnetic field from the first secondary winding. This current opposes and cancels the current flowing through the primary winding from the D.C. power supply. A voltage is also generated in the second secondary winding which biases the second switching means to become conductive. Once the second switching means becomes conductive it sustains this reverse current flow condition in the primary winding. Also, by shunting the primary tap to the common lead, the potential at the anode of the thyristor is held below the negative potential of the D.C. supply due to the opposition current in the portion of the primary winding between the tap and the thyristor anode, thereby positively turning off the thyristor.

While there are several types of reverse blocking triode thyristors suitable for use with the invention, a silicon-controlled rectifier (SCR) is used in the preferred embodiment. The switches are transistors which are biased to become conductive or nonconductive. In some preferred embodiments, the control circuit is used as an inverter and includes means for applying the thyristor gate signal and the first and second switching means conducting signals cyclically and sequentially so that the thyristor is turned alternately on and off.

It is therefore an object of the present invention to provide a circuit for positively turning off a silicon controlled rectifier D.C. power circuit.

It is a further object of the invention to provide an SCR commutation circuit of low manufacturing cost.

It is another object of the invention to provide a simple and reliable SCR commutation circuit.

It is yet another object of the invention to provide an SCR commutation circuit which minimizes induced electrical stresses in the SCR.

The foregoing and other objectives, features and advantages of the invention will be more readily understood upon consideration of the following detailed description of certain preferred embodiments of the invention, taken in conjunction with the accompanying drawings.

BRIEF DESCRIPTION OF THE DRAWINGS

FIG. 1 is a schematic diagram of a simplified form of the invention; and

FIG. 2 is a schematic diagram of the invention as incorporated into an inverter circuit.

DETAILED DESCRIPTION OF THE PREFERRED EMBODIMENTS

Referring now more particularly to FIG. 1, direct current electrical power from an external D.C. source 10 is supplied to a load 12 through a manually-controlled switch 14 connected in series with the primary winding 16 of a transformer 18 to the anode of a silicon controlled rectifier (SCR) 20. The cathode of the SCR 20 is connected to the load. The return current path from the load is through a common line 22.

The transformer 18 has a first secondary winding 24 and a second secondary winding 26. One lead of the secondary winding 24 is connected to the D.C. source 10 through the switch 14. The other lead of the secondary winding 24 is connected to the collector lead of an NPN transistor 28 whose emitter lead is connected to the common lead. The transistor 28 constitutes a first switch for use in shutting off the SCR 20 as will be explained in further detail.

One lead of the second secondary winding 26 is connected to the common lead and the other end of the winding is connected to the base lead of a second NPN transistor 30. The emitter lead of the transistor 30 is connected to the common lead and the collector is connected to a tap in the primary winding 16 of the transformer 18. The transistor 30 constitutes a second switch for use in shutting off the SCR 20.

The tap divides the primary winding into two sections referenced A and B. The A section of the primary 16 comprises the bulk of the primary winding. A diode 32 is connected in parallel with the transistor 30 but in the reverse conductivity direction, that is, with its anode connected to the common lead 22 and its cathode connected to the tap.

In operation, direct current electrical power is furnished to the circuit by closing the switch 14. The SCR 20 is then turned on by the application of a proper gate signal to its gate lead in a conventional manner. D.C. current then flows through the primary winding 16, the SCR 20, and the load 12, returning via the common lead 22. The magnetic field produced in the primary winding 16 as a result of this current passes through the core of the transformer 18 in a directional sense determined by the polarity of the D.C. power and the polarity of the winding 16.

The current stop sequence is initiated by the conventional application of a proper base drive biasing signal to the base of the transistor 28. It is to be understood that the application of the gate signal to the SCR 20 and to the transistor 28 may be easily done by switches connected to proper bias sources or by elaborate sequencing circuits of the type described below in reference to FIG. 2. For the purposes of this description, however, it is not necessary to describe means for generating these gate signals since any proper gate signal, however generated, will function for the purpose of this illustration.

As the shut-off bias signal is applied to the base of the transistor 28, the transistor is made conductive, thereby causing electrical current to flow through the secondary winding 24.

Secondary winding 24 is wound in opposition to the primary winding 16. The current flow through the winding 24 generates a magnetic field in the core of the transformer which opposes the field generated by the primary winding 16. The turns ratio of the winding 24 to the winding 16 is made as large as possible in accordance with the voltage capability of the transistor switch 28. The magnetic field of the winding 24 will cancel the field from the winding 16. Direct current is permitted to continue to flow through the winding 24 until the transformer core approaches magnetic saturation. This will occur provided the transistor is made conductive for a predetermined period of time.

After the core of the transformer 18 is saturated, the transistor 28 is biased to become nonconductive by terminating the signal applied to its base. The magnetic field created in the winding 28 then collapses and induces a voltage in the primary winding 16 which is in opposition to the supply voltage and momentarily stops the flow of current through the SCR 20 and the load 12. A voltage is simultaneously induced in the secondary winding 26 which provides a base drive bias to the second transistor 30, causing it to become conductive. Once the transistor 30 becomes conductive, the reverse current condition in the A section of the primary winding 16 is sustained and a corresponding voltage is induced in the B section of the primary winding 16. The polarity of the voltage in the B portion of the primary winding 16 is such that a negative potential is applied to the anode of the SCR 20 which is below the negative potential of the D.C. supply voltage 10, thereby reverse biasing the SCR 20 and positively shutting it off.

This condition persists until the core of the transformer 18 saturates again, thereby removing the base drive supplied by the secondary winding 26 to the second transistor switch 30. Upon the opening of the transistor switch 30, all current flow ceases and the circuit is ready for the entire cycle to be repeated. The duration that the anode of the SCR 20 remains more negative than the negative supply voltage value can be designed sufficiently long to provide positive assurance that the thyristor is turned off.

The sequence of initiating current through the windings 16 and 24 is not critical. Thus, it is possible to initially draw current through the winding 24 before drawing current through the winding 16. All that is necessary is that the field created by the winding 24 cancel the field produced by the primary winding 16.

Referring now more particularly to FIG. 2, the shut-off circuit according to the invention is applied for controlling a traction motor. Elements of the circuit corresponding to those shown in FIG. 1 have been given the same reference numerals. In the circuit of FIG. 2, current flow through the secondary winding 24 is initiated prior to the main current flow through the primary winding 16 in order to avoid circuit complexities caused by the initial inductive reaction in the primary winding 16 if it were turned on first, and to extend the time of current flow in the winding 24 over one duty cycle. The primary shut-off circuit is identical to that shown in FIG. 1, except that the load 12 is now a traction motor 12' which has a diode 34 connected in parallel with it. The diode's anode is connected to the common line 22. Means are now provided, however, for controlling the gate signals which are applied to the SCR 20 and to the first switch 28' so that the SCR 20 is alternately turned on and off to produce an interrupted D.C. current in the motor 12'.

The side of the switch 14 opposite from the D.C. power supply 10, in addition to being connected to the windings 16 and 24, is also connected through a resistor 36 to the emitter lead of an NPN transistor 38. The emitter lead of the transistor 38 is connected to the cathode of a Zener diode 40 whose anode is connected to the common lead 22. The collector of the transistor 38 is connected through a resistor 42 to the base of a PNP transistor 44. The emitter of the transistor 44 is connected to the switch 14. The collector of the transistor 44 is connected to a line 46. The switch 14 is also connected through a resistor 48 to the anode of a silicon unilateral switch (SUS) 50. The anode of the SUS 50 is also connected through a resistor 52 to the common lead 22. The cathode of the SUS 50 is connected to a circuit node 54.

The base lead of the transistor 38 is connected to the anode of a diode 56 whose cathode is connected to the node 54. The anode of the diode 56 is connected through a resistor 58 to a circuit node 60.

The node 60 is connected to the anode of the SCR 20 and to the cathode of a diode 62 whose anode is connected to the node 54. A capacitor 64 and a resistance 66 are connected in parallel between the node 54 and the common lead 22. The node 54 is further connected through a resistance 68 to the cathode of a Zener diode 70. The cathode of the diode 70 is also connected through a resistance 72 to the node 60.

The node 60 is connected to the cathode of a diode 74 whose anode is connected through a variable resistance 76 and a fixed resistance 78 to the line 46. The anode of the diode 74 is also connected through a capacitor 80 to the common line 22. The anode of a four-layer (Shockley) diode 82 is connected to the anode of the diode 74. The cathode of the diode 82 is connected to the primary winding 86 of a transformer 84. A diode 88 is connected across the winding 86 with its cathode connected to the cathode of the diode 82. The other end of the winding 86 and the anode of the diode 88 are connected to the common line 22.

The line 46 is connected through a resistor 90 to the base of an NPN transistor 92. The base of the transistor 92 is connected through a resistor 94 to the common lead 22. The collector of the transistor 92 is connected to a common node 96 which is connected through the secondary winding 24 to the switch 14. The emitter of the transistor 92 is connected through a resistor 98 to the common lead 22 and to the emitters of three, NPN, cascaded transistors 100, 102, and 104. The emitters of these transistors are connected through separate resistors 106, 108 and 110, respectively, to the common lead 22. The collectors of these transistors are all connected to the common node 96. A diode 112 has its anode connected to the common lead 22 and its cathode connected to the node 96. A resistor 114 in series with a capacitor 116 is connected in parallel with the diode 112.

The anode of the Zener diode 70 is connected to the emitter of the transistor 100. The secondary winding 118 of the transformer 84 connects the gate electrode of the SCR 20 to its cathode.

In operation, main positive D.C. power is applied by closing the switch 14. Emitter bias is then applied to transistor 38 through resistor 36 and the Zener diode 40. Voltage compensation bias is applied to SUS 50 through resistor 48 and resistor 52. Emitter bias voltage is applied to transistor 44.

Control current flows through primary winding 16, and the anode of SCR 20 assumes a potential which is nearly that of the positive supply voltage potential. Zener voltage is established across the diode 70 and the resistor 106 by current flow through resistor 72. Transistor 38 becomes conductive due to base drive supplied through resistor 58. Driver transistor 44 turns on and, in turn, causes the cascade connected transistors 92, 100, 102 and 104 to become conductive, thereby initiating current flow through the first secondary winding 24.

The voltage across capacitor 80 rises at a rate which is controlled by the resistors 76 and 78 until the breakdown potential of the four layer Shockley diode 82 is reached. Thereafter, capacitor 80 is discharged through the primary winding 86 of the transformer 84. An induced signal is thereby generated in the secondary winding 118 which is applied to the gate electrode of the SCR 20 to make the SCR conductive.

Main direct current power then flows through the series connection of the primary winding 16, the SCR 20, the motor 12' and the common lead 22. This condition continues until the core of the transformer 18 saturates due to the current flow through the secondary winding 24; a time determined by the transformer design. Thereafter, the resulting voltage rise across the resistor 106, in addition to the Zener voltage of the diode 70, exceeds the breakdown voltage of SUS 50 as applied through the voltage divider network of resistors 66 and 68.

When the SUS 50 breaks down, the voltage applied to the base of the transistor 38 drops below the emitter bias voltage and turns off the transistors 38, 44, 92, 100, 102 and 104. Current flow through the secondary winding 24 then stops and the SCR 20 is shut off in substantially the same manner as described above in reference to FIG. 1.

During the stop interval, SUS 50 is reverse biased through the diode 62 and is therefore reset. The diode 82 is also reverse biased and capacitor 80 is discharged for reset through the diode 74. The stop interval is concluded by the saturation of the core of transformer 18 by the current flow through the primary winding 16. This causes the transistor 30 to become nonconductive with the resultant loss of the drive furnished by winding 26. The anode voltage of the SCR 20 thereafter rises and the cycle automatically repeats itself.

The circuit described in reference to FIG. 2 provides inherent current limiting; a desirable feature in traction motor control. This results because higher than rated load current in the primary winding 16 induces a corresponding high current in the secondary winding 24 which immediately initiates the turn-off cycle.

A working embodiment of this circuit has been constructed and its performance has been demonstrated. The operating frequency was 125 Hz. The control voltage is 10% to 15% of the supply. The supply voltage tolerance is 10 to 45 volts. Maximum current was 225 amps.

The terms and expressions which have been employed here are used as terms of description and not of limitations, and there is no intention, in the use of such terms and expressions of excluding equivalents of the features shown and described, or portions thereof, it being recognized that various modifications are possible within the scope of the invention claimed.

What is claimed is:

1. A control circuit for interrupting the supply of a direct current (D.C.) power from an external source to a load, the control circuit comprising
    a common lead;
    a reverse blocking triode thyristor;
    a transformer having a saturable core, a tapped primary winding, a secondary winding wound in opposition to the primary winding and wherein
        the D.C. power supply, the primary winding the thyristor, the load, and the common lead are connected together in series;
    means for connecting the secondary winding across the D.C. power supply to generate a secondary magnetic field in the transformer core having a predetermined polarity and magnitude and then disconnecting the secondary winding from the D.C. supply;
    means for causing the thyristor to become conductive and thereby causing electrical current to flow through the primary winding and the load, whereby a primary magnetic field is generated in the primary winding and transformer core which is in opposition to and cancels the secondary magnetic field; and
    means for shunting the primary tap to the common lead immediately after the secondary winding is disconnected from the D.C. supply, whereby the collapse of the secondary magnetic field upon the disconnection of the secondary winding from the D.C. supply generates an opposing current in the primary winding which, when the primary tap is shunted to the common lead, reverse biases the thyristor to positively shut it off.

2. A control circuit as recited in claim 1, wherein the thyristor is a silicon-controlled rectifier (SCR) having a gate control lead and wherein the means for causing the thyristor to become conductive include means for applying an appropriate bias signal to the SCR gate lead.

3. A control circuit as recited in claim 1, wherein the means for shunting the primary winding tap is sensitive to the magnetic field within the core and disconnects the tap from the common lead upon the saturation of the primary core.

4. A control circuit for interrupting the supply of direct current (D.C.) power from an external source to a load, the control circuit comprising
   a common lead;
   a reverse blocking triode thyristor having separate anode, cathode and gate leads;
   a transformer having a saturable core, a tapped primary winding, a first secondary winding and a second secondary winding, the first secondary winding being wound in opposition to the primary winding;
   first switching means;
   electronic, second switching means having a pair of switching terminals and a control terminal; and wherein
   the D.C. power supply, the primary winding, the thyristor, the load, and the common lead are connected together in series;
   the first secondary winding is connected in series with the first switching means between the common lead and the D.C. power supply;
   the second secondary winding is connected between the common lead and the control terminal of the second switching means;
   one of the switching contacts of the second switching means is connected to the common lead and the other is connected to the tap of the transformer's primary winding;
   gate trigger means for applying a gate signal to the thyristor gate lead to cause the thyristor to become conductive and thereby cause electrical current to flow through the primary winding and the load whereby a magnetic field is generated in the primary winding and transformer core;
   switch trigger means for causing the first switching means to become conductive for a time period sufficient to saturate the transformer core and generate a magnetic field in the core which is of a magnitude and polarity to enable it to oppose and cancel the magnetic field in the core, produced by the primary winding, and then to open circuit the first switching means;
   whereby a current is momentarily generated in the primary winding which opposes and cancels the current produced therein by the D.C. power supply and a voltage is also generated in the second secondary winding which biases the second switching means to become conductive and shunt the primary winding tap to the common lead, to sustain this condition and to hold the potential of the anode of the thyristor below the negative potential of the D.C. supply so that the thyristor is positively turned off.

5. A control circuit as recited in claim 4, wherein the second switching means becomes nonconductive upon saturation of the transformer core and resets the control circuit.

6. A control circuit as recited in claim 4, wherein the thyristor is a silicon-controlled rectifier.

7. A control circuit as recited in claim 4, wherein the first switching means includes an electronic switch having a pair of switching leads and a control lead.

8. A control circuit as recited in claim 4, wherein the gate trigger means and the switch trigger means are interconnected and further including means for alternately operating said interconnected means.

9. A control circuit as recited in claim 8, wherein the switch trigger means operate prior to the gate trigger means so that D.C. current is initially flowing in the first secondary winding when the thyristor is gated on.

10. A control circuit as recited in claim 9, wherein the switch trigger means include a time delay circuit for triggering the gate trigger means a predetermined time after the first switch means are caused to become conductive.

11. A control circuit as recited in claim 8, wherein the switch trigger means sense the potential between the common lead and the interconnection of the thyristor and the primary winding and trigger the first switch means to be conductive when said potential reaches a predetermined value.

12. A control circuit as recited in claim 5, further comprising means connected to the first secondary winding and triggered by a predetermined current flow through it, which is indicative of transformer core saturation, for shutting off the first and second switching means.

13. A method of commutating a thyristor comprising the steps of supplying D.C. current through a tapped primary winding of a saturable core transformer to the thyristor, whereby a primary magnetic field is generated in the core of the transformer,
   generating an opposing magnetic field in the transformer core of sufficient magnitude to cancel the primary magnetic field;
   collapsing the opposing magnetic field to induce an opposing current in the transformer primary winding which blocks the flow of D.C. current to the thyristor; and
   maintaining the opposing current and reverse biasing the thyristor by then shunting the primary winding tap to the circuit ground.

14. A method of commutating a thyristor as recited in claim 13, wherein the shunting step comprises the steps of sensing the collapse of the opposing magnetic field and shunting the primary tap to the circuit ground at the initiation of the collapse, maintaining the shunt until the transformer core is magnetically saturated, and thereafter disconnecting the shunt.

* * * * *